United States Patent
Lu (10) Patent No.: US 11,721,949 B1
(45) Date of Patent: Aug. 8, 2023

(54) NON-CONTACT WAFER-LEVEL BURN-IN COMPRISING A WIRELESS POWER TRANSFER COMPONENT

(71) Applicant: Lumentum Operations LLC, San Jose, CA (US)

(72) Inventor: Chien-Yao Lu, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 17/809,146

(22) Filed: Jun. 27, 2022

Related U.S. Application Data (60) Provisional application No. 63/269,830, filed on Mar. 23, 2022.

(51) Int. Cl.
  *H02J 50/12* (2016.01)
  *H01S 5/00* (2006.01)
  *H01S 5/42* (2006.01)

(52) U.S. Cl.
  CPC ............ *H01S 5/0021* (2013.01); *H02J 50/12* (2016.02); *H01S 5/423* (2013.01)

(58) Field of Classification Search
  CPC .. H02J 50/12; H02J 50/00; H02J 50/10; H02J 50/005; G06F 1/26; H04B 10/11
  USPC .......................................... 250/214 R, 214.1
  See application file for complete search history.

(56) References Cited

U.S. PATENT DOCUMENTS

| 6,885,202 B2 | 4/2005 | Slupsky |
| 2016/0041030 A1* | 2/2016 | Saxena ................. H01L 27/144 250/208.2 |

OTHER PUBLICATIONS

"WiTricity, Technology Overview," WiTricity Corporation, Watertown, MA, 2022, 4 pages.

* cited by examiner

*Primary Examiner* — Que Tan Le
(74) *Attorney, Agent, or Firm* — Harrity & Harrity, LLP (57) ABSTRACT

In some implementations, a semiconductor wafer includes a plurality of optical emitters, wherein an optical emitter, of the plurality of optical emitters, is associated with a receiver conducting medium for receiving wireless power transfer, wherein the receiver conducting medium is configured to couple to a wireless power transfer component for wireless power transfer at a common resonant frequency, and wherein the receiver conducting medium is configured to power the optical emitter to provide an optical output when the wireless power transfer is applied at the common resonant frequency.

20 Claims, 5 Drawing Sheets

NON-CONTACT WAFER-LEVEL BURN-IN COMPRISING A WIRELESS POWER TRANSFER COMPONENT

CROSS-REFERENCE TO RELATED APPLICATION

This Patent Application claims priority to U.S. Provisional Patent Application No. 63/269,830, filed on Mar. 23, 2022, and entitled "NON-CONTACT WAFER-LEVEL BURN-IN AND TESTING USING WIRELESS POWER TRANSFER." The disclosure of the prior Application is considered part of and is incorporated by reference into this Patent Application.

TECHNICAL FIELD

The present disclosure relates generally to optical emitters and to non-contact wafer-level burn-in for optical emitters, such as vertical cavity surface emitting lasers (VCSELs).

BACKGROUND

Optical emitters may be used to emit an optical beam or other optical signal. For example, a vertical-emitting device, such as a vertical-cavity surface-emitting laser (VCSEL), is a laser in which a laser beam is emitted in a direction perpendicular to a surface of a substrate (e.g., vertically from a surface of a semiconductor wafer). Many optical emitters may be manufactured on a single semiconductor wafer, which may then be divided or singulated to separate the optical emitters into discrete optical devices.

SUMMARY

In some implementations, an electro-optical system includes a test bed configured to receive a semiconductor wafer with a set of optical emitters, wherein an optical emitter, of the set of optical emitters, is associated with a receiver conducting medium for receiving wireless power transfer; a wireless power transfer component configured to transfer power to the set of optical emitters of the semiconductor wafer, wherein the wireless power transfer component is associated with a power charging conducting medium to couple to the receiver conducting medium for wireless power transfer, wherein the power charging conducting medium and the receiver conducting medium are associated with a common resonant frequency for wireless power transfer; and a receiver component configured to measure an optical output of the set of optical emitters.

In some implementations, a semiconductor wafer includes a plurality of optical emitters, wherein an optical emitter, of the plurality of optical emitters, is associated with a receiver conducting medium for receiving wireless power transfer, wherein the receiver conducting medium is configured to couple to a wireless power transfer component for wireless power transfer at a common resonant frequency, and wherein the receiver conducting medium is configured to power the optical emitter to provide an optical output when the wireless power transfer is applied at the common resonant frequency.

In some implementations, a method includes activating, by a device, a wireless power transfer component to wirelessly transfer power to a set of emitters of a semiconductor wafer for a configured burn-in time, wherein each emitter, of the set of emitters, includes a receiver conducting medium for coupling to the wireless power transfer component at a configured frequency; activating, by the device, a receiver component to perform a set of measurements of the set of emitters in connection with wirelessly transferring power to the set of emitters; and outputting, by the device, a result of the set of measurements performed by the receiver component.

BRIEF DESCRIPTION OF THE DRAWINGS

FIG. 2 is a diagram of an example electro-optical system associated with non-contact wafer-level burn-in.

FIGS. 3 and 4 are diagrams of examples associated with non-contact wafer-level burn-in.

FIG. 5 is a flowchart of an example process associated with non-contact wafer-level burn-in.

DETAILED DESCRIPTION

The following detailed description of example implementations refers to the accompanying drawings. The same reference numbers in different drawings may identify the same or similar elements.

With increasingly improved manufacturing processes, many components may be manufactured on a single substrate. For example, a single 150 millimeter (mm) semiconductor wafer may be manufactured with approximately 200,000 component chips formed thereon. One example of a component that can be manufactured on a semiconductor wafer is an optical emitter. Examples of optical emitters include vertical emitters (e.g., vertical cavity surface emitting lasers (VCSELs), such as top-emitting VCSELs or bottom-emitting VCSELs), edge emitters, or light emitting diodes.

Manufacturers may subject optical emitters to testing to ensure that defective optical emitters are not deployed in optical systems, optical emitters. For example, a manufacturer may divide a single semiconductor wafer with many optical emitters into many individual semiconductor dice each with a single optical emitter. The manufacturer may attach a mechanical probe system to the single optical emitter to provide electrical current to the single optical emitter. The manufacturer may measure an output and/or response of the optical emitter to determine whether the optical emitter is operating as intended and, if so, may certify the optical emitter for deployment.

The mechanical probe may also be used for wafer burn-in. Wafer burn-in is a process by which electrical current is supplied to a semiconductor and an optical emitter thereon to age the optical emitter. In other words, wafer burn-in simulates a process of using the optical emitter in a deployment scenario to screen out defective optical emitters that fail early in a product lifetime and stabilize chip performance. Typically, optical emitter testing and wafer burn-in are performed after semiconductor singulation (division of the semiconductor into individual optical emitters). When a quantity of optical emitters on a semiconductor is very small and a burn-in current is relatively low, on an order of hundreds of mechanical probes may be attached to a semiconductor to perform concurrent burn-in on multiple optical emitters before singulation. However, as the quantity of chips increases, the quantity of mechanical probes and the amount of current that is to be applied may exceed practical limits. For example, performing concurrent burn-in on a semiconductor with 200,000 optical emitters, each requiring 5 milliamps (mA) of current, may result in use of a probe-card with over 200,000 mechanical probes, making contact with the 200,000 optical emitters, and supplying 1000 amps (A) of current. Manufacturing such a probe-card and supplying the required power may be impractical, especially as the quantity of optical emitters on a single semiconductor increases further.

Some implementations described herein enable non-contact wafer-level burn-in and testing for optical emitters. For example, an optical emitter may include a receiver conducting medium that can be coupled to a wireless power transfer component for wireless power transfer. In this case, the wireless power transfer component can transfer power to many optical emitters on a single semiconductor substrate concurrently to perform wafer-level testing of optical emitter output or wafer-level burn-in for simulated aging. In this case, by using wireless power transfer via resonant coupling, some implementations described herein eliminate a need for contacting mechanical probes to optical emitters, thereby enabling concurrent, pre-singulation testing and burn-in for increasing quantities of optical emitters. Moreover, although the usage of total power would be the same, using wireless power transfer may reduce an amount of current of the transferring system which delivers power to test and/or burn-in a quantity of optical emitters by increasing the voltage of the transferring system. Additionally, or alternatively, wireless power transfer, described herein, enables testing and burn-in for bottom-emitting devices (e.g., bottom emitting VCSELs), thereby increasing a flexibility of designs that can be deployed for optical systems.

Figure 1A:
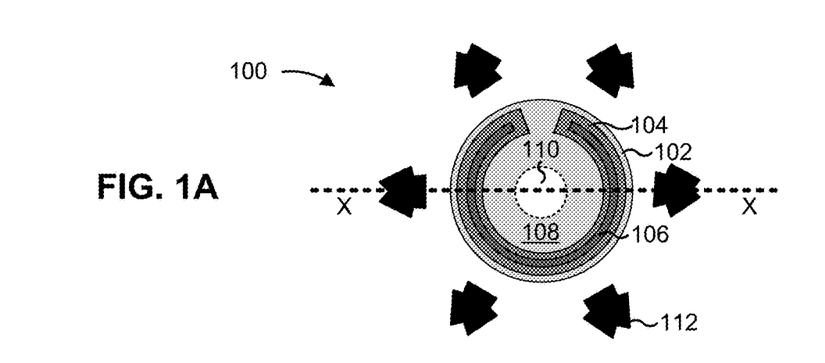
FIGS. 1A and 1B are diagrams depicting a top-view of an example emitter and a cross-sectional view of example emitter along the line X-X, respectively.
Figure 1B:
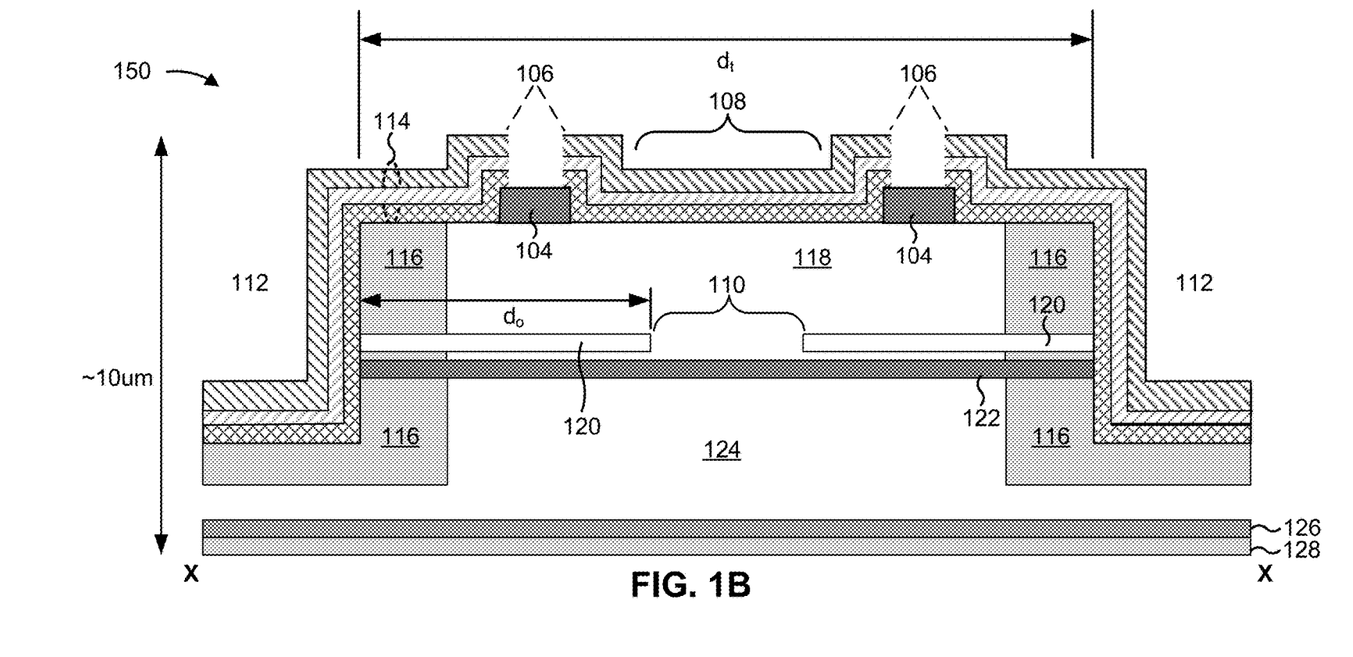

FIGS. 1A and 1B are diagrams depicting a top-view of an example emitter 100 and a cross-sectional view 150 of example emitter 100 along the line X-X, respectively. As shown in FIG. 1A, emitter 100 may include a set of emitter layers constructed in an emitter architecture. In some implementations, emitter 100 may correspond to one or more vertical-emitting devices described herein. For example, emitter 100 may correspond to a VCSEL described herein.

As shown in FIG. 1A, emitter 100 may include an implant protection layer 102 that is circular in shape in this example. In some implementations, implant protection layer 102 may have another shape, such as an elliptical shape, a polygonal shape, or the like. Implant protection layer 102 is defined based on a space between sections of implant material (not shown) included in emitter 100.

As shown in FIG. 1A, emitter 100 includes an ohmic metal layer 104 (e.g., a P-Ohmic metal layer or an N-Ohmic metal layer) that is constructed in a partial ring-shape (e.g., with an inner radius and an outer radius). A first area of ohmic metal layer 104 is covered by a protective layer (e.g., a dielectric layer or a passivation layer) of emitter 100, and a second area of ohmic metal layer 104 is exposed by via 106, described below. As shown, ohmic metal layer 104 overlaps with implant protection layer 102. Such a configuration may be used, for example, in the case of a P-up/top-emitting emitter 100; however, alternate configurations for, for example, a bottom-emitting emitter 100 are contemplated.

Not shown in FIG. 1A, emitter 100 includes a protective layer in which via 106 is formed (e.g., etched). As described above, the second area of ohmic metal layer 104 is exposed by via 106 (e.g., the shape of the second area may be a result of the shape of via 106) while the first area of ohmic metal layer 104 (e.g., an area of ohmic metal layer 104 other than the second area exposed by via 106) is covered by some protective layer. In other words, the protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes a current confinement aperture 110 (e.g., an oxide aperture formed by an oxidation layer of emitter 100 (not shown)). Current confinement aperture 110 is formed below optical aperture 108.

As further shown in FIG. 1A, emitter 100 includes a set of trenches 112 (e.g., oxidation trenches) that are spaced (e.g., equally or unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The number and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112, in practice, other configurations are possible, such as a compact emitter that includes five trenches 112, seven trenches 112, or another quantity of trenches. In some implementations, trench 112 may encircle emitter 100 to form a mesa structure. As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are possible. For example, the design of emitter 100 may apply in the context of another type of optical device, such as a light emitting diode (LED), an edge emitting laser, or another type of emitting (e.g., top emitting or bottom emitting) optical device. Additionally, the design of emitter 100 may apply to emitters of any wavelength, power level, and/or emission profile. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "X-X" in FIG. 1A). As shown, emitter 100 may include a backside cathode layer 128, a substrate layer 126, a bottom mirror 124, an active region 122, an oxidation layer 120, a top mirror 118, an implant isolation material 116, a protective layer 114 (e.g., a dielectric passivation/mirror layer), and an ohmic metal layer 104. As shown, emitter 100 may have, for example, a total height that is approximately 10 micrometers (μm).

Backside cathode layer 128 may include a layer that makes electrical contact with substrate layer 126. For example, backside cathode layer 128 may include an annealed metallization layer, such as a gold-germanium-nickel (AuGeNi) layer, a palladium-germanium-gold (PdGeAu) layer, or the like.

Substrate layer 126 may include a base substrate layer upon which epitaxial layers are grown. For example, substrate layer 126 may include a semiconductor layer, such as a gallium-arsenide (GaAs) layer, an indium-phosphide (InP) layer, and/or another type of semiconductor layer. Bottom mirror 124 may include a bottom reflector layer of emitter 100. For example, bottom mirror 124 may include a distributed Bragg reflector (DBR). Active region 122 may include a layer that confines electrons and defines an emission wavelength of emitter 100. For example, active region 122 may be a quantum well. Oxidation layer 120 may include an oxide layer that provides optical and electrical confinement of emitter 100. In some implementations, oxidation layer 120 may be formed as a result of wet oxidation of an epitaxial layer. For example, oxidation layer 120 may be an Al2O3 layer formed as a result of oxidation of an aluminum-arsenide (AlAs) layer or an aluminum-gallium-arsenide (AlGaAs) layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. A size of current confinement aperture 110 may range, for example, from approximately 4 μm to approximately 20 μm. In some implementations, a size of current confinement aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as do in FIG. 1B) toward a center of emitter 100, thereby forming oxidation layer 120 and current confinement aperture 110. In some implementations, current confinement aperture 110 may include an oxide aperture. Additionally, or alternatively, current confinement aperture 110 may include an aperture associated with another type of current confinement technique, such as an etched mesa, a region without ion implantation, lithographically defined intra-cavity mesa and regrowth, or the like.

Top mirror 118 may include a top reflector layer of emitter 100. For example, top mirror 118 may include a DBR. Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102. Protective layer 114 may include a layer that acts as a protective passivation layer and which may act as an additional DBR. For example, protective layer 114 may include one or more sub-layers (e.g., a dielectric passivation layer and/or a mirror layer, a silicon-dioxide (SiO2) layer, a silicon-nitride (Si3N4) layer, an aluminum-oxide (Al2O3) layer, or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted. Ohmic metal layer 104 may include a layer that makes electrical contact through which electrical current may flow. For example, ohmic metal layer 104 may include a titanium (Ti) and a gold (Au) layer, a Ti and a platinum (Pt) layer and/or an Au layer, or the like, through which electrical current may flow (e.g., through a bondpad (not shown) that contacts ohmic metal layer 104 through via 106). Ohmic metal layer 104 may be P-ohmic, N-ohmic, or other forms known in the art. Selection of a particular type of ohmic metal layer 104 may depend on the architecture of the emitters and is well within the knowledge of a person skilled in the art. Ohmic metal layer 104 may provide ohmic contact between a metal and a semiconductor and/or may provide a non-rectifying electrical junction and/or may provide a low-resistance contact. In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside cathode layer 128 may be deposited on a bottom side of substrate layer 126.

The number, arrangement, thicknesses, order, symmetry, or the like, of layers shown in FIG. 1B is provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100 and any layer may comprise more than one layer.

Figure 2:
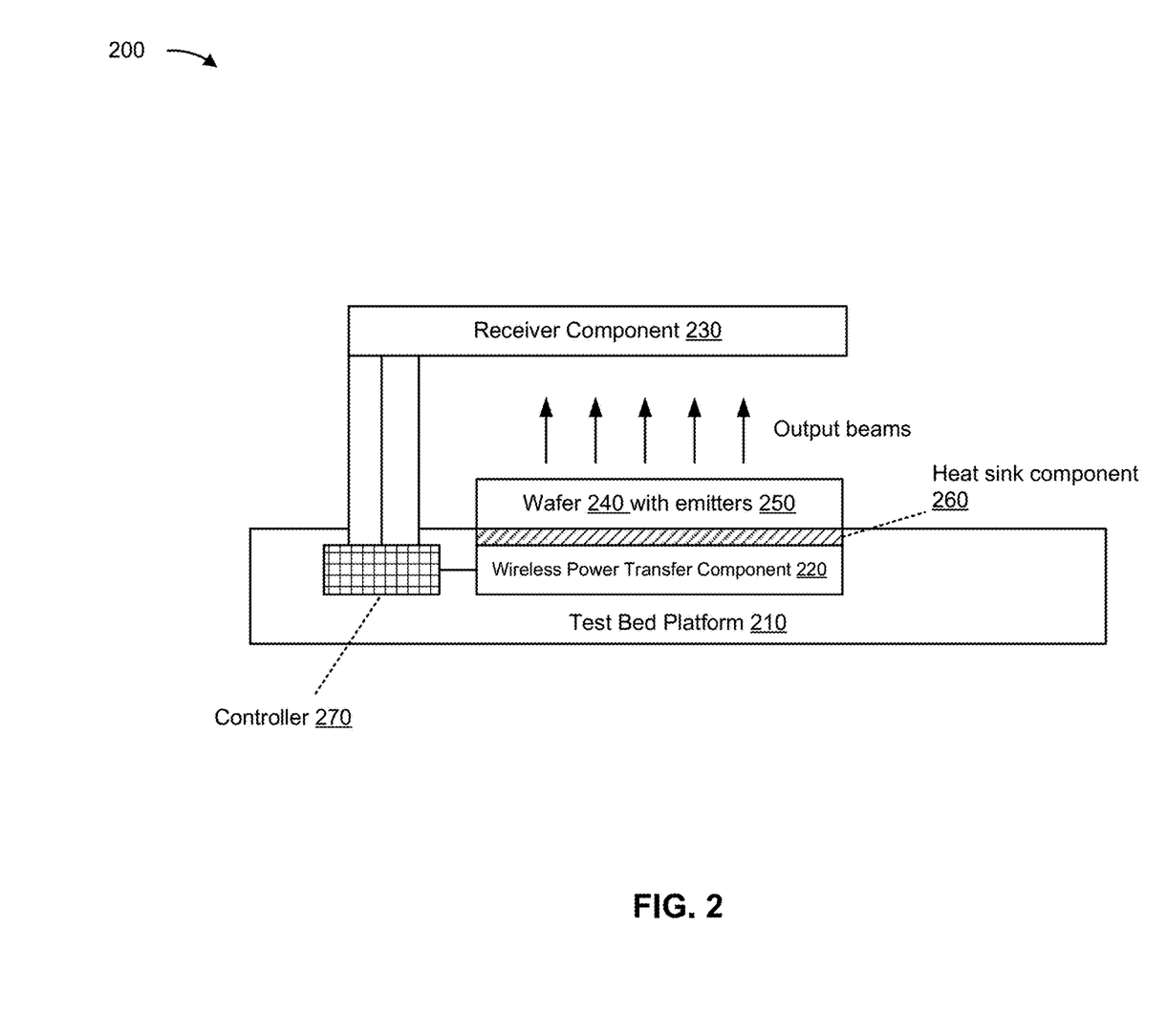

FIG. 2 is a diagram of an example electro-optical system 200 associated with non- contact wafer-level burn-in. As shown in FIG. 2, the electro-optical system 200 may include a test bed platform 210, a wireless power transfer component 220, and a receiver component 230. In some implementations, the electro-optical system 200 may include a controller 270 to control the wireless power transfer component 220 and/or the receiver component 230.

As further shown in FIG. 2, the test bed platform 210 may be configured to receive a semiconductor wafer 240 with a set of emitters 250 provided thereon. The semiconductor wafer 240 may be in a range of approximately 50 millimeters (mm) to 450 mm; however, other larger or smaller semiconductor wafers are contemplated. In some implementations, the semiconductor wafer 240 may have 200,000 or more emitters 250 provided thereon. In some implementations, the test bed platform 210 may have a heat sink component 260. For example, the test bed platform 210 may include a heat sink or a heat source component 260 onto which the semiconductor wafer 240 and the set of emitters 250 are disposed, thereby enabling thermal management for the semiconductor wafer 240 and the set of emitters 250 during burn-in and/or testing. The semiconductor wafer 240 and the set of emitters 250 may be disposed on the test bed platform 210 (e.g., on a heat sink or a heat source component 260 and/or the wireless power transfer component 220) without a direct electrical connection (e.g., with only a wireless electrical connection formed from an induced current, resonant effect when power is being transferred by the wireless power transfer component 220). Additionally, or alternatively, the semiconductor wafer 240 may have an electrical connection, but the electrical connection may not be used for concurrent power transfer and/or testing of the emitters 250. For example, the semiconductor wafer 240 may have an electrical trace that connects to the test bed platform 210 to enable determination that the semiconductor wafer 240 is disposed on the test bed platform 210 at a configured position or to enable grounding of the semiconductor wafer 240.

An emitter 250, of the set of emitters 250, may correspond to one or more of emitters 100. For example, to perform non-contact wafer-level burn-in and/or non-contact testing of a set of emitters 250, a semiconductor wafer 240, on which the set of emitters 250 are formed, is disposed on the test bed platform 210 in alignment with the wireless power transfer component 220. In this case, the wireless power transfer component 220 may be activated (e.g., based on a control signal from the controller 270), which may cause the wireless power transfer component 220 to wirelessly provide power to the set of emitters 250 or a subset thereof, as described in more detail herein. The wireless power transfer component 220 may provide power, wirelessly, to one or more emitters 250 via wireless coupling (e.g., inductive power transfer). For example, an emitter 250 may have a receiver conducting medium that can be coupled to a transmitter conducting medium of the wireless power transfer component 220 (e.g., based on the receiver conducting medium and the transmitter conducting medium having a common resonant frequency). In this case, power is transferred to the receiver conducting medium of the emitter 250 and from the receiver conducting medium of the emitter 250 to one or more emission components of the emitter 250 (e.g., to cause the emitter 250 to emit an optical beam). In some implementations, a conducting medium may include a coil (e.g., an inductive coil), such as a receiver coil or a transmitter coil, or an antenna, such as a receiver antenna or a transmitter antenna, among other examples.

In some implementations, the wireless power transfer component 220 may receive a configured amount of current to provide wireless power. For example, the wireless power transfer component 220 may receive 500 amps (A) of current through a higher voltage to cause the wireless power transfer component 220 to provide wireless power. In this case, based on receiving less than the 1000 A of current, as is used for contact-based burn-in of large quantities of emitters, the wireless power transfer component 220 saves power resources and avoids excessive heat, which can cause damage to the semiconductor wafer 240 and the emitters 250. In this way, implementations described herein enable scaling to concurrent burn-in and/or testing of increasing quantities of emitters 250 by reducing a power consumption associated with burn-in and/or testing of each emitter 250.

In some implementations, the controller 270 may control a characteristic of the current. For example, as described in more detail herein, the controller 270 may change a magnitude or frequency of the current to adjust a magnitude or frequency of the wireless power that is transferred to the emitters 250 and/or a magnitude of optical beams output by the emitters 250. In some implementations, a frequency for wireless power coupling may be in a range of several kilohertz (kHz) to tens of megahertz (MHz) (e.g., from 1 kHZ to 100 MHz). In some implementations, the wireless power transfer component 220 may provide power for a particular period of time. For example, a configured burn-in time may be in a range of approximately few hours to tens of hours. Additionally, or alternatively, the wireless power transfer component 220 may provide power for multiple periods of time, such as a first period of time at a first frequency for burn-in of a first subset of emitters 250 and a second period of time at a second frequency for burn-in of a second subset of emitters 250, as described in more detail herein. Additionally, or alternatively, the wireless power transfer component 220 may provide power during a first period of time for burn-in and during a second period of time for measurement.

Based on multiple emitters 250 coupling to the wireless power transfer component 220, activating the wireless power transfer component 220 may cause multiple output beams to be generated. In this case, the receiver component 230 may receive the multiple output beams to perform a set of measurements. For example, the receiver component 230 may measure whether an output beam, of the multiple output beams, matches a set of configured characteristics, such as a configured wavelength, an optical output power LI curve (e.g., a light (L) versus current (I) curve), a near field pattern, or a far field pattern, among other examples. to determine whether a corresponding emitter 250 is operating as intended. After the set of measurements is performed, the controller 270 may deactivate the wireless power transfer component 220 to complete a burn-in or measurement procedure.

In some implementations, the wireless power transfer component 220 may perform a burn-in procedure on the emitters 250. For example, by supplying power to the emitters 250, the wireless power transfer component 220 may cause the emitters 250 to be aged, which may result in the emitters 250 achieving a steady-state of performance that can be measured to determine whether the emitters 250 are and will be functioning as intended. The aging or burn-in process and/or associated testing may comprise an on-wafer highly accelerated lifetime (HALT) test of one or more conditions of the emitters 250 (e.g., without assembling each emitter into a separate structure for testing, such as a transistor outline (TO) can package).

In other words, during a first period of a lifetime of an emitter 250, the emitter 250 may output a beam with a first characteristic (e.g., a first wavelength or a first optical power) and during a second period of a lifetime of the emitter 250, the emitter 250 may output a beam with a second characteristic (e.g., a second wavelength or a second optical power) that is a desired characteristic (e.g., a wavelength or optical power that the emitter 250 is configured to provide for a system). By aging the emitter 250, the emitter 250 is moved from the first period of the lifetime of the emitter 250 to the second period of the lifetime of the emitter 250 and can be measured to determine whether the second characteristic matches the desired characteristic (e.g., the emitter 250 is functioning as intended). In some cases, the emitter 250 may fail during the first period of the lifetime of the emitter 250. Such an emitter 250 may be classified as defective, and may not be deployed in an optical system, thereby reducing a need for replacement of deployed emitters. In some cases, the emitter 250 may not achieve the desired characteristic after a configured burn-in period. Such an emitter 250 may be subject to further burn-in (e.g., until the desired characteristic is achieved) or classified as defective and may not be deployed in an optical system, thereby reducing a need for replacement of deployed emitters. In some cases, the emitter 250 may achieve the desired characteristic and may be deployed as a properly working emitter. Although some implementations are described in terms of measurement of a characteristic to determine whether burn-in is effective, other techniques are contemplated, such as timing-based burn-in whereby emitters are deployed after a configured burn-in time (e.g., without measurement).

In some implementations, the receiver component 230 may output a result of a set of measurements (e.g., to the controller 270 or another client device (not shown)) to enable quality control and/or burn-in control to be performed. In this way, the receiver component 230 enables identification of properly working and improperly working emitters 250 for pre-deployment quality control, as described above. Additionally, or alternatively, the receiver component 230 may determine whether one or more characteristics associated with emitter burn-in are satisfied. For example, the controller 270 may end wafer-level burn-in of the semiconductor wafer 240 and the emitters 250 based on a measurement of the receiver component 230 (e.g., indicating that the emitters 250 are producing output beams at a steady-state corresponding to burn-in being completed). Additionally, or alternatively, the controller 270 may end wafer-level burn-in based on expiration of a timer associated with indicating that burn-in is complete.

In some implementations, the wireless power transfer component 220 may provide power for burn-in without measurement. For example, the wireless power transfer component 220 may burn-in the emitters 250 without measurements being performed on the emitters 250. Alternatively, the wireless power transfer component 220 may provide power for measurement without burn-in. For example, the wireless power transfer component 220 may cause the emitters 250 to output beams to enable large-volume defect screening (e.g., concurrent identification of defects in the emitters 250) without burning-in or aging the emitters 250. In some implementations, the semiconductor wafer 240 may be singulated (e.g., divided into individual semiconductor wafers 240 with emitters 250 provided thereon, such as multiple wafers 240 each with a single emitter 250) after completing burn-in and/or testing.

In some implementations, the wireless power transfer component 220 may provide power for another functionality. For example, the wireless power transfer component 220 may provide power to enable image acquisition (for instance of near field patterns or far field patterns of the emitter). In this case, the test bed platform 210 may be an optical system and the wireless power transfer component 220 may enable powering of multiple emitters 250 without blockage by electrical connectors (e.g., probes of a probe card).

As indicated above, FIG. 2 is provided as an example. Other examples may differ from what is described with regard to FIG. 2.

Figure 3:
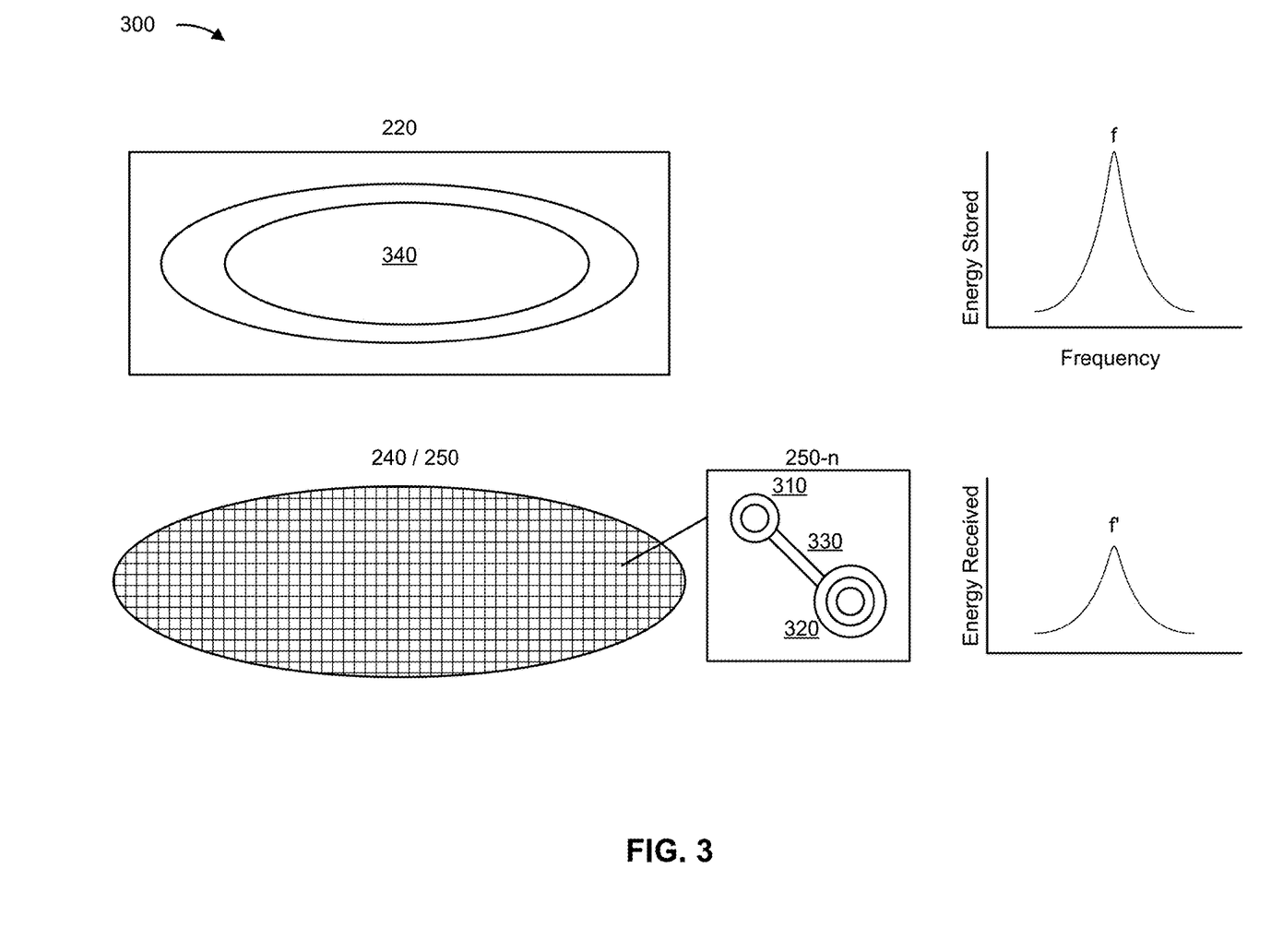
Figure 4:
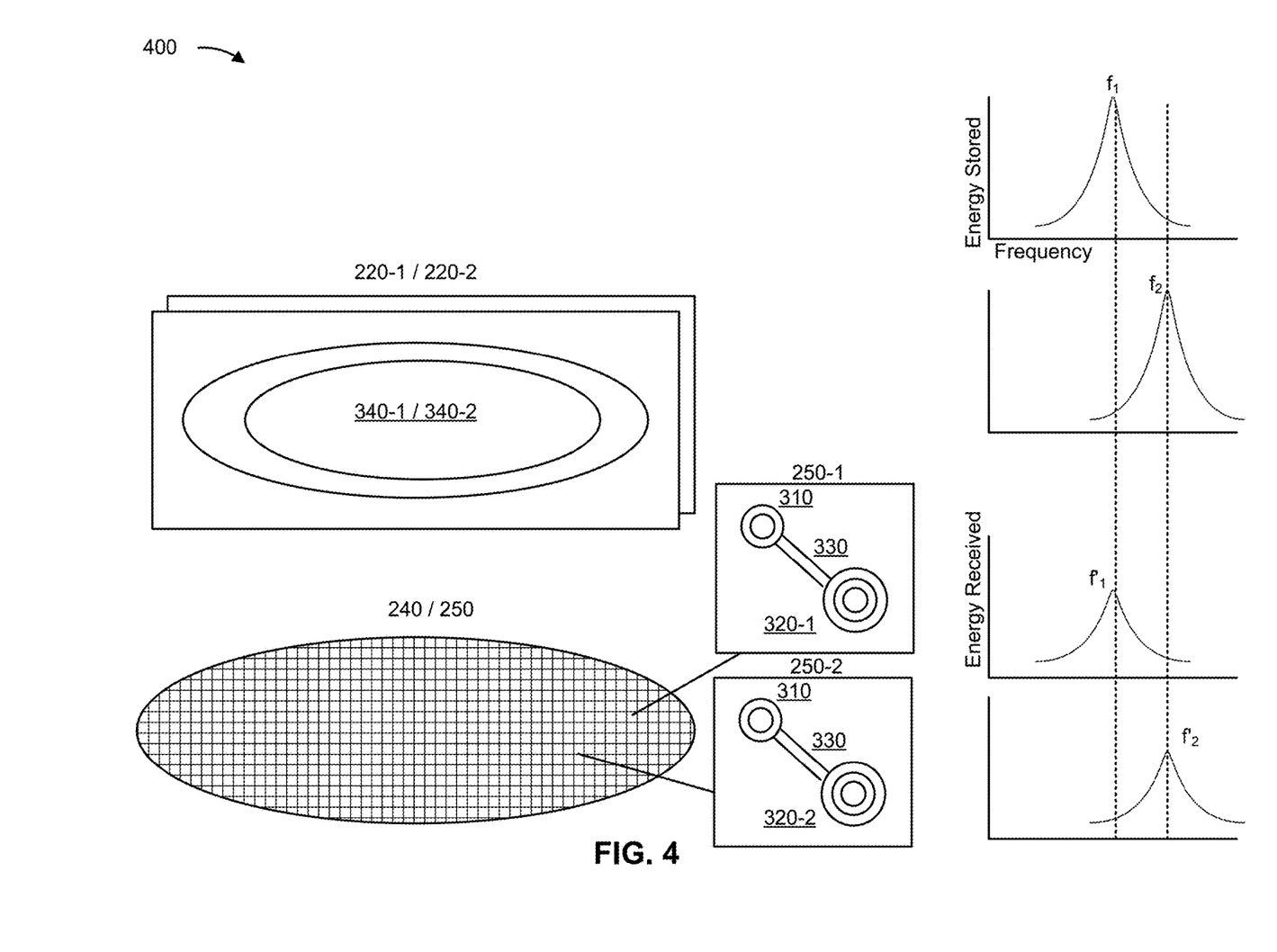

FIGS. 3 and 4 are diagrams of examples 300/400 associated with non-contact wafer-level burn-in. As shown in FIG. 3, the example 300 may include the wireless power transfer component 220, the semiconductor wafer 240, and the set of emitters 250. As shown in FIG. 4, the example 400 may include a set of wireless power transfer components 220, the semiconductor wafer 240, and the set of emitters 250. In some implementations, semiconductor wafer 240 may be a single monolithic wafer. In some implementations, semiconductor wafer 240 may be multiple semiconductor wafers. For example, a semiconductor wafer 240 may have been divided into a plurality of sub-wafers, which may be tested concurrently in a test bed (and, in some examples, may be further singulated into individual wafers after testing, as described herein). Additionally, or alternatively, the semiconductor wafer 240 may be multiple, separately manufactured wafers that are positioned for concurrent testing (and, in some examples, may be further singulated into individual wafers after testing, as described herein).

An emitter 250-$n$, of the set of emitters 250, may include an emission component 310, a receiver conducting medium 320 (e.g., a receiver coil), and a power coupling 330. The receiver conducting medium 320 may be formed from one or more electrical traces and may be configured to receive wireless power transfer and provide the wirelessly transferred power to the emission component 310 via the power coupling 330. The power may be wirelessly transferred to cause the emission component 310 to output an optical beam and/or to burn-in. The wireless power transfer component may include a transmitter conducting medium 340 (e.g., a transmitter coil) that is configured to wirelessly transfer power to receiver conducting media 320 of the emitters 250 via resonant coupling. Although the transmitter conducting medium 340 is shown as approximately the same size as the semiconductor wafer 240, it is contemplated that the transmitter conducting medium 340 may be larger or smaller than the semiconductor wafer 240. In some implementations, each emitter 250 may have a corresponding receiver conducting medium 320. In some implementations, multiple emitters 250 may share a common receiver conducting medium 320. For example, a single receiver conducting medium 320 may have multiple power couplings 330 to multiple emission components 310 of multiple emitters 250, such as in a case of a VCSEL array with multiple emitters on a single singulated wafer of semiconductor wafer 240. In some implementations, some emitters 250 may not be connected to receiver conducting media 320. For example, when performing concurrent testing on emitters 250, a first subset of emitters 250 may not be manufactured with a receiver conducting medium 320 (e.g., emitters 250 that do not include receiver conducting media 320) and a second subset of emitters 250 may be manufactured with receiver conducting media 320, and testing may be performed on the second subset of emitters 250 and not the first subset of emitters 250. This may reduce a cost and/or wafer size associated with emitters 250 by having some sections of semiconductor wafer 240 omit respective receiver conducting media 320 and performing the testing on other sections of semiconductor wafer 240 (e.g., using statistical sampling techniques).

As further shown in FIG. 3, the transmitter conducting medium 340 may be configured to have a resonant frequency f representing a maxima frequency for energy storage in transmitter conducting medium 340 (e.g., which can be transferred through resonant coupling). Similarly, the receiver conducting medium 320 may have a resonant frequency of f' representing a maxima frequency for energy received in the receiver conducting medium 320. In some implementations, the transmitter conducting medium 340 and the receiver conducting medium 320 may be configured such that f≈f'. For example, the transmitter conducting medium 340 and the receiver conducting medium 320 may be configured such that f' is within approximately 10 hertz (Hz) of f to enable efficient power transfer.

In some implementations, different emitters 250 may have corresponding receiver conducting media 320 with different resonant frequencies corresponding to different sub-components (e.g., transmitter conducting media 340) of the wireless power transfer component 220. For example, as shown in FIG. 4, a first emitter 250-1 may have a first receiver conducting medium 320-1 with a first resonant frequency $f'_1$ and a second emitter 250-2 may have a second receiver conducting medium 320-2 with a second resonant frequency $f'_2$. In this case, a first wireless power transfer component 220-1 and a second wireless power transfer component 220-2 may include a first transmitter conducting medium 340-1 and a second transmitter conducting medium 340-2, respectively, with a first resonant frequency $f_1$ and a second resonant frequency $f_2$, respectively, to couple to the multiple different resonant frequencies. Although first transmitter conducting medium 340-1 and second transmitter conducting medium 340-2 are shown as stacked, it is contemplated that another arrangement of transmitter conducting media 340 may be possible, such as a side-by-side arrangement, an overlapping arrangement, or the like.

In one example, a test bed platform 210 may have multiple wireless power transfer components 220 each with a single transmitter conducting medium 340 configured for a different resonant frequency. In another example, a single wireless power transfer component 220 may have multiple transmitter conducting media 340 configured for multiple different resonant frequencies. In another example, a single wireless power transfer component 220 may have multiple transmitter conducting media 340 configured for the same resonant frequencies.

In some implementations, a single transmitter conducting medium 340 may be controlled to have multiple different resonant frequencies (e.g., based on a characteristic of power provided to the single transmitter conducting medium 340). Alternatively, multiple transmitter conducting media 340 with the same configuration (e.g., shape) may be controlled to have multiple different resonant frequencies. By providing wireless power transfer using multiple different resonant frequencies, a test bed platform 210 can provide differentiated testing and/or wafer-level burn-in for a wafer 240 and a set of emitters 250. For example, a wireless power transfer components 220 may couple to a first subset of emitters 250 (e.g., each with receiver conducting media 320 with the first resonant frequency $f'_1$) with a first power level and/or for a first period of time and may couple to a second subset of emitters 250 (e.g., each with receiver conducting media 320 with the second resonant frequency $f'_2$) with a second power level and/or for a second period of time. In this way, the wireless power transfer component 220 achieves differentiated burn-in and/or testing for different emitters 250. In some implementations, the wireless power transfer components 220 may output power at different power levels or frequencies at different periods of time to apply different stress conditions to one or more emitters 250, such as applying multiple frequencies of power to a single emitter 250 with two receiver conducting media 320 associated with two resonant frequencies, applying multiple levels of power to an emitter 250, or a combination thereof In some implementations, the first resonant frequency $f_1$ may differ from the second resonant frequency $f_2$ by a threshold amount to avoid or minimize unintended coupling. For example, the first resonant frequency may differ from the second resonant frequency by at least approximately 10 Hz to ensure that emitters 250 with the second resonant frequency do not wirelessly receive more than a threshold level of power when the wireless power transfer component 220 is providing power to the emitters 250 with the first resonant frequency. Although some implementations are described herein in terms of a single resonant frequency or two resonant frequencies, other quantities of resonant frequencies for emitters on a single semiconductor wafer 240 are contemplated. Additionally, or alternatively, other configurations whereby, for example, multiple wafers 240 (e.g., each with sets of emitters 250, such as a first semiconductor wafer 240 with first emitters 250 with the first resonant frequency and a second semiconductor wafer 240 with second emitters 250 with the second resonant frequency) are disposed in a common test bed platform 210 are contemplated.

As indicated above, FIGS. 3 and 4 are provided as examples. Other examples may differ from what is described with regard to FIGS. 3 and 4.

Figure 5:
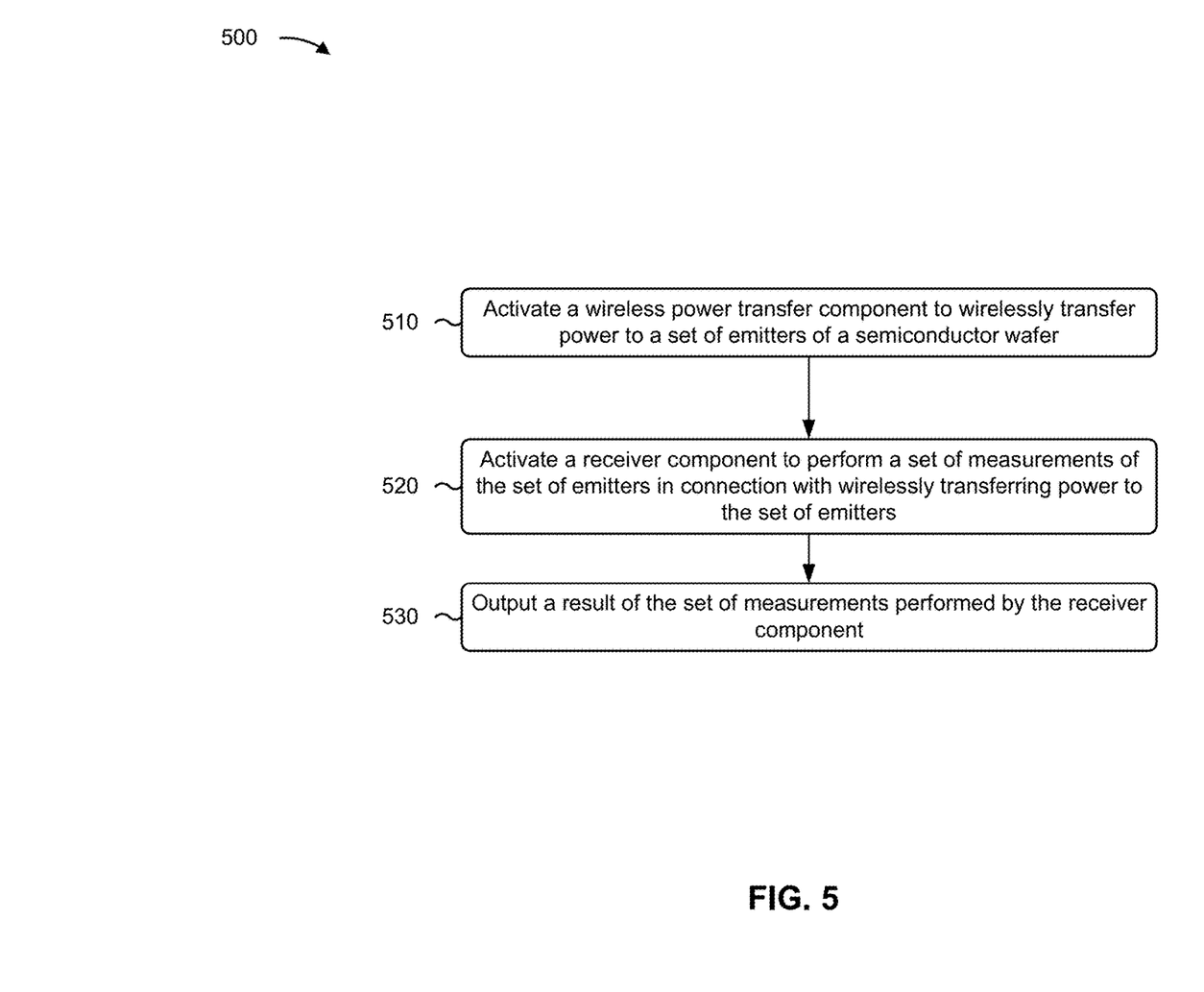

FIG. 5 is a flowchart of an example process 500 associated with non-contact wafer-level burn-in. In some implementations, one or more process blocks of FIG. 5 are performed by a testing device (e.g., the controller 270 or other electrical control component associated with the test bed platform 210). In some implementations, one or more process blocks of FIG. 5 are performed by another device or a group of devices separate from or including the testing device, such as a wireless power transfer component (e.g., the wireless power transfer component 220), a receiver component (e.g., the receiver component 230), and/or an emitter (e.g., the emitters 250).

As shown in FIG. 5, process 500 may include activating a wireless power transfer component to wirelessly transfer power to an emitter or a set of emitters of a semiconductor wafer (block 510). For example, the testing device may activate a wireless power transfer component to wirelessly transfer power to a set of emitters of a semiconductor wafer for a configured burn-in time, as described above. In some implementations, each emitter, of the set of emitters, includes a receiver conducting medium for coupling to the wireless power transfer component at a configured frequency.

As further shown in FIG. 5, process 500 may include activating a receiver component to perform a set of measurements of the set of emitters in connection with wirelessly transferring power to the set of emitters (block 520). For example, the testing device may activate a receiver component to perform a set of measurements of the set of emitters in connection with wirelessly transferring power to the set of emitters, as described above.

As further shown in FIG. 5, process 500 may include outputting a result of the set of measurements performed by the receiver component (block 530). For example, the testing device may output a result of the set of measurements performed by the receiver component, as described above.

Process 500 may include additional implementations, such as any single implementation or any combination of implementations described below and/or in connection with one or more other processes described elsewhere herein.

In a first implementation, process 500 includes deactivating the wireless power transfer component based on an expiration of the configured burn-in time, and outputting, based on the expiration of the configured burn-in time, the result of the set of measurements performed by the receiver component.

In a second implementation, alone or in combination with the first implementation, process 500 includes burning in the set of emitters of the semiconductor wafer using the wireless power transfer component, activating the receiver component to perform another set of measurements of the set of emitters in connection with burning in the set of emitters, and outputting information associated with a comparison of the set of measurements and the other set of measurements.

In a third implementation, alone or in combination with one or more of the first and second implementations, activating the wireless power transfer component includes activating the wireless power transfer component to concurrently output power at a first configured frequency, for coupling to a first receiver conducting medium of a first emitter of the set of emitters, and at a second configured frequency for coupling to a second receiver conducting medium of a second emitter of the set of emitters.

In a fourth implementation, alone or in combination with one or more of the first through third implementations, activating the wireless power transfer component includes activating the wireless power transfer component to output power, at a first time, at a first configured frequency, for coupling to a first receiver conducting medium of a first emitter of the set of emitters, and, at a second time, at a second configured frequency, for coupling to a second receiver conducting medium of a second emitter of the set of emitters, wherein the first time is different from the second time.

In a fifth implementation, alone or in combination with one or more of the first through fourth implementations, the first frequency differs from the second frequency by at least 10 (Hz).

In a sixth implementation, alone or in combination with one or more of the first through fifth implementations, the set of emitters includes at least one of a set of VCSELs, a set of top-emitting VCSELs, a set of bottom-emitting VCSELs, a set of edge emitters, or a set of light emitting diodes.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An electro-optical system, comprising:
    a test bed configured to receive a semiconductor wafer with a set of optical emitters,
        wherein an optical emitter, of the set of optical emitters, is associated with a receiver conducting medium for receiving wireless power transfer;
    a wireless power transfer component configured to transfer power to the set of optical emitters of the semiconductor wafer,
        wherein the wireless power transfer component is associated with a power charging conducting medium to couple to the receiver conducting medium for wireless power transfer,
        wherein the power charging conducting medium and the receiver conducting medium are associated with a common resonant frequency for wireless power transfer; and
    a receiver component configured to measure an optical output of the set of optical emitters.

2. The electro-optical system of claim 1, wherein a first optical emitter, of the set of optical emitters, and a second optical emitter, of the set of optical emitters, share a common receiver conducting medium.

3. The electro-optical system of claim 1, further comprising:
    a controller configured to:
        activate the wireless power transfer component to wirelessly transfer power to the set of optical emitters of the semiconductor wafer for a configured burn-in time; and
        deactivate the wireless power transfer component based on an expiration of the configured burn-in time.

4. The electro-optical system of claim 1, further comprising:
    a controller configured to:
        activate the receiver component to perform a set of measurements of the set of optical emitters in connection with wirelessly transferring power to the set of optical emitters; and
        output a result of the set of measurements performed by the receiver component.

5. The electro-optical system of claim 1, wherein the wireless power transfer component includes a first sub-component associated with a first resonant frequency to couple to a first subset of optical emitters, of the set of optical emitters, and a second sub-component associated with a second resonant frequency to couple to a second subset of optical emitters of the set of optical emitters.

6. The electro-optical system of claim 1, wherein the test bed is configured to receive the semiconductor wafer for wireless power transfer before wafer singulation.

7. The electro-optical system of claim 1, further comprising:
a heat sink to receive the semiconductor wafer.

8. The electro-optical system of claim 1, wherein the test bed is configured to receive the semiconductor wafer without an electrical connection to the semiconductor wafer or the set of VCSELs when the wireless power transfer is not occurring.

9. The electro-optical system of claim 1, further comprising:
an electrical control component to provide electrical control to the wireless power transfer component,
wherein a characteristic of an output of power from the wireless power transfer component is based on the electrical control provided to the wireless power transfer component.

10. A semiconductor wafer, comprising:
a plurality of optical emitters,
wherein an optical emitter, of the plurality of optical emitters, is associated with a receiver conducting medium for receiving wireless power transfer,
wherein the receiver conducting medium is configured to couple to a wireless power transfer component for wireless power transfer at a common resonant frequency, and
wherein the receiver conducting medium is configured to power the optical emitter to provide an optical output when the wireless power transfer is applied at the common resonant frequency.

11. The semiconductor wafer of claim 10, wherein at least one optical emitter, of the plurality of optical emitters, does not include a receiver conducting medium.

12. The semiconductor wafer of claim 10, wherein a first optical emitter, of the plurality of optical emitters, includes a first receiver conducting medium for receiving wireless power transfer at a first resonant frequency, and
wherein a second optical emitter, of the plurality of optical emitters, includes a second receiver conducting medium for receiving wireless power transfer at a second resonant frequency that is different from the first resonant frequency.

13. The semiconductor wafer of claim 10, wherein the receiver conducting medium includes one or more electrical traces.

14. A method, comprising:
activating, by a device, a wireless power transfer component to wirelessly transfer power to a set of emitters of a semiconductor wafer,
wherein each emitter, of the set of emitters, includes a receiver conducting medium for coupling to the wireless power transfer component at a configured frequency;
activating, by the device, a receiver component to perform a set of measurements of the set of emitters in connection with wirelessly transferring power to the set of emitters; and
outputting, by the device, a result of the set of measurements performed by the receiver component.

15. The method of claim 14, further comprising:
deactivating, by the device, the wireless power transfer component based on an expiration a configured burn-in time; and
wherein outputting the result of the set of measurements performed by the receiver component comprises:
outputting, based on the expiration of the configured burn-in time, the result of the set of measurements performed by the receiver component.

16. The method of claim 14, further comprising:
burning in the set of emitters of the semiconductor wafer using the wireless power transfer component;
activating the receiver component to perform another set of measurements of the set of emitters in connection with burning in the set of emitters; and
outputting information associated with a comparison of the set of measurements and the other set of measurements.

17. The method of claim 14, wherein activating the wireless power transfer component comprises:
activating the wireless power transfer component to concurrently output power at a first configured frequency, for coupling to a first receiver conducting medium of a first emitter of the set of emitters, and at a second configured frequency for coupling to a second receiver conducting medium of a second emitter of the set of emitters.

18. The method of claim 14, wherein activating the wireless power transfer component comprises:
activating the wireless power transfer component to output power, at a first time, at a first configured frequency, for coupling to a first receiver conducting medium of a first emitter of the set of emitters, and, at a second time, at a second configured frequency, for coupling to a second receiver conducting medium of a second emitter of the set of emitters,
wherein the first time is different from the second time.

19. The method of claim 18, wherein the first configured frequency differs from the second configured frequency by at least 10 Hertz.

20. The method of claim 14, wherein the set of emitters includes at least one of:
a set of vertical cavity surface emitting lasers (VCSELs),
a set of top-emitting VCSELs,
a set of bottom-emitting VCSELs,
a set of edge emitters, or
a set of light emitting diodes.

* * * * *